US009231780B2

(12) United States Patent  
Yoo et al.

(10) Patent No.: US 9,231,780 B2  
(45) Date of Patent: Jan. 5, 2016

(54) RADIO FREQUENCY SWITCHING CIRCUIT AND ELECTRONIC DEVICE

(71) Applicant: SAMSUNG ELECTRO-MECHANICS CO., LTD., Suwon-si, Gyeonggi-do (KR)

(72) Inventors: Hyun Jin Yoo, Suwon-si (KR); Hyun Hwan Yoo, Suwon-si (KR); Yoo Hwan Kim, Suwon-si (KR); Jong Myeong Kim, Suwon-si (KR); Dae Seok Jang, Suwon-si (KR); Yoo Sam Na, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/461,933

(22) Filed: Aug. 18, 2014

(65) Prior Publication Data

US 2015/0214931 A1 Jul. 30, 2015

(30) Foreign Application Priority Data

Jan. 28, 2014 (KR) ........................ 10-2014-0010524

(51) Int. Cl.
*H04B 1/44* (2006.01)
*H04L 12/50* (2006.01)
*H03K 17/10* (2006.01)
(Continued)

(52) U.S. Cl.
CPC .............. *H04L 12/50* (2013.01); *H03K 17/102* (2013.01); *H03K 17/693* (2013.01); *H04L 12/10* (2013.01); *H03K 2017/066* (2013.01)

(58) Field of Classification Search
CPC ...... H04L 12/10; H04L 12/50; H03K 17/102; H03K 17/693; H03K 2017/066
USPC ........................ 455/78, 77, 333, 338, 550.1
See application file for complete search history.

(56) References Cited

U.S. PATENT DOCUMENTS 6,804,502 B2 * 10/2004 Burgener .................. H01P 1/15  
    257/341  
7,910,993 B2 * 3/2011 Brindle ............. H01L 29/78609  
    257/347

(Continued)

FOREIGN PATENT DOCUMENTS

JP     2011-166663 A     8/2011  
JP     2012-90012 A     5/2012  
KR     10-2012-0070485 A     6/2012

OTHER PUBLICATIONS

Korean Office Action issued on Aug. 21, 2015 in counterpart Korean Application No. 10-2014-0010524. (10 pages; 5 pages of English, 5 pages of Korean).

*Primary Examiner* — Marceau Milord  
(74) *Attorney, Agent, or Firm* — NSIP Law

(57) ABSTRACT

A radio frequency (RF) switching circuit may include: a first switching circuit unit connected between a first signal port for signal transmission and reception and a common connection node connected to an antenna port and operated according to a first gate signal; a second switching circuit unit connected between a second signal port for signal transmission and reception and the common connection node and operated according to a second gate signal; a negative voltage generating unit generating a negative voltage using a voltage of an RF signal from the common connection node; and a gate signal generating unit generating the first and second gate signals using the negative voltage from the negative voltage generating unit and an operating voltage.

20 Claims, 10 Drawing Sheets

(51) Int. Cl.
  *H03K 17/693* (2006.01)
  *H04L 12/10* (2006.01)
  *H03K 17/06* (2006.01)

(56) References Cited

U.S. PATENT DOCUMENTS

| | | | | |
|---|---|---|---|---|
| 8,232,827 B2* | 7/2012 | Sagae | ................... | H03K 17/102 327/308 |
| 8,390,339 B2* | 3/2013 | Seshita | ................ | H03K 17/063 327/108 |
| 8,723,260 B1* | 5/2014 | Carroll | .................... | H01L 21/84 257/347 |
| 8,923,782 B1* | 12/2014 | Ravindran | .............. | H01L 25/18 257/368 |
| 8,970,279 B2* | 3/2015 | Ha | ......................... | H03K 17/16 327/308 |
| 8,977,217 B1* | 3/2015 | Connick | .......... | H03K 17/04123 257/368 |
| 2003/0090313 A1* | 5/2003 | Burgener | ................. | H01P 1/15 327/408 |
| 2006/0194567 A1* | 8/2006 | Kelly | .................... | H03K 17/063 455/408 |
| 2009/0167409 A1* | 7/2009 | Suko | .............. | H03K 19/018557 327/427 |
| 2010/0156511 A1 | 6/2010 | Botula et al. | | |
| 2013/0257510 A1 | 10/2013 | Suzaki et al. | | |
| 2013/0328597 A1* | 12/2013 | Cassia | ................... | G11C 5/145 327/109 |
| 2014/0062575 A1* | 3/2014 | Hurwitz | ............... | H03K 17/161 327/379 |

\* cited by examiner

RADIO FREQUENCY SWITCHING CIRCUIT AND ELECTRONIC DEVICE

CROSS-REFERENCE TO RELATED APPLICATION

This application claims the benefit of Korean Patent Application No. 10-2014-0010524 filed on Jan. 28, 2014, with the Korean Intellectual Property Office, the disclosure of which is incorporated herein by reference.

BACKGROUND

The present disclosure relates to a radio frequency (RF) switching circuit and an electronic device.

Semiconductor integrated circuits (ICs) installed in communications systems include an RF switching circuit controlling a transmission path of an RF signal between an antenna, a transmission unit and a reception unit. Such an RF switching circuit is used in communications systems such as Bluetooth™, cellular personal communication service (PCS)/code division multiple access (CDMA)/wideband code division multiple access (WCDMA)/time division multiple access (TDMA)/global system/standard for mobile communications (GSM), and the like, as well as in local area networks (LAN).

In general, an RF switching circuit is used between a transmission unit and a reception unit in various communications systems using time-division multiplexing (TDM). Using an RF switching circuit, a transmission unit and a reception unit are alternately turned on and off, reducing overall power consumption of a system and interference between the transmission unit and the reception unit.

RF switching circuits are required to have low insertion loss, high isolation, high switching speeds, and high power handling capability, and also, to have low harmonic distortion, namely, high linearity, with respect to a large input signal.

As insertion loss increases, degradations of the sensitivity of a reception unit and transmission power loss of a transmission unit caused by a switch may be further reduced. Power handling capability guarantees maximum output power from a transmission unit. High isolation may minimize an influence on a reception unit in an OFF state when a transmission unit operates, and vice versa.

In particular, mobile communications systems are required to essentially have insertion loss and power handling capability.

In an existing wireless communications device, an RF switching circuit includes a plurality of RF ports respectively connected to a plurality of transmission units and reception units and a common port connected to an antenna.

The RF switching circuit controls a transmission path of an RF signal between the plurality of RF ports and the common port to allow one of the plurality of transmission units and reception units connected to the RF switching circuit to be selected and electrically connected to the antenna.

In order to change a transmission path of an RF signal between each of the RF ports and the common port, the existing RF switching circuit may include a switching circuit unit connected between each of the RF ports and the common port and a shunt circuit unit connected between each of the RF ports and a ground.

The switching circuit unit includes a transmission switching circuit unit (Tx SW) and a reception switching circuit unit (Rx SW), and each of the transmission switching circuit unit and the reception switching circuit unit may include a plurality of semiconductor switches.

The semiconductor switches, switching elements formed on a silicon-on-insulator (SOI) board, may be configured as metal oxide silicon field effect transistors (MOSFETs).

In the existing RF switching circuit, in preparation for applying a signal having a voltage higher than a breakdown voltage of a single transistor, the switching circuit unit may have a structure in which a plurality of transistors are stacked.

In the structure in which a plurality of transistors are stacked, a voltage higher than a rated voltage is dividedly applied to each of the plurality of transistors, and thus, a voltage applied to a single transistor is lowered, protecting the transistors from the high voltage.

In the existing RF switching circuit, a gate signal Vg lower or higher than a threshold voltage Vth of the transistors included in the transmission switching circuit unit and the reception switching circuit unit is provided to a gate of each of the transistors to control the transistors to be turned on or off. The gate signal Vg may be provided from a baseband chip set.

In order to secure isolation required between transmission units and reception units, the existing RF switching circuit may need a negative voltage generating unit providing a gate signal, as a negative voltage, for controlling the switching circuit unit for selecting a signal path to be turned off.

When such a negative voltage generating unit is additionally provided, complexity in design operation and costs increase as much.

Patent document 1 below relates to an RF switching circuit and a method of controlling an RF switching circuit. This document, however, does not disclose technical matters for generating a negative gate signal using a voltage of an RF signal in a common connection port to which an antenna is connected.

RELATED ART DOCUMENT (Patent Document 1) Korean Patent Laid-Open Publication No. 10-2012-0070485

SUMMARY

An exemplary embodiment in the present disclosure may provide a radio frequency (RF) switching circuit capable of generating a negative gate signal using a voltage of an RF signal in a common connection node to which an antenna is connected, and an electronic device.

According to an exemplary embodiment in the present disclosure, a radio frequency (RF) switching circuit may include: a first switching circuit unit connected between a first signal port for signal transmission and reception and a common connection node connected to an antenna port and operated according to a first gate signal; a second switching circuit unit connected between a second signal port for signal transmission and reception and the common connection node and operated according to a second gate signal; a negative voltage generating unit generating a negative voltage using a voltage of an RF signal from the common connection node; and a gate signal generating unit generating the first and second gate signals using the negative voltage from the negative voltage generating unit and an operating voltage.

According to an exemplary embodiment in the present disclosure, a radio frequency (RF) switching circuit may include: a first switching circuit unit connected between a first signal port for signal transmission and reception and a common connection node connected to an antenna port and operated according to a first gate signal; a second switching circuit unit connected between a second signal port for signal transmission and reception and the common connection node and operated according to a second gate signal; a negative voltage generating unit generating a negative voltage using a voltage of an RF signal from the common connection node; a first gate signal generating unit selecting one of the negative voltage from the negative voltage generating unit and an operating voltage according to a switching control signal, and providing the selected voltage as the first gate signal; and a second gate signal generating unit selecting the other of the negative voltage from the negative voltage generating unit and the operating voltage, which has not been selected by the first gate signal generating unit, according to the switching control signal, and providing the selected voltage as the second gate signal.

The negative voltage generating unit may include: a level adjusting unit adjusting a voltage level of an RF signal from the common connection node; and a negative rectifying unit negative-rectifying the RF signal with a voltage level adjusted by the level adjusting unit to generate the negative voltage.

The level adjusting unit may include: first to Nth MOS transistors connected in series between the common connection node and an input terminal of the negative rectifying unit and reducing a voltage level of the RF signal; impedance resistors connected between gates and grounds of the first to Nth MOS transistors, respectively; and path resistors connected between sources and drains of the first to Nth MOS transistors, respectively.

The level adjusting unit may further include: an MOS transistor having a diode connection structure with a source connected to the common connection node and a drain and a gate connected to the gate of the first MOS transistor.

The negative rectifying unit may include: a negative rectifying circuit negative-rectifying the RF signal with a voltage level adjusted by the level adjusting unit; and a smoothing unit smoothing a voltage rectified by the negative rectifying circuit and providing the negative voltage.

The negative rectifying circuit may include: a rectifying MOS transistor having a diode-connection structure with a source connected to the level adjusting unit and a drain and a gate connected to the smoothing unit; and a resistor connected between the rectifying MOS transistor and a ground.

The negative rectifying circuit may include a rectifying diode having a cathode connected to the level adjusting unit and an anode connected to the smoothing unit.

According to an exemplary embodiment in the present disclosure, an electronic device may include: a first switching circuit unit connected between a first signal port for signal transmission and reception and a common connection node connected to an antenna port and operated according to a first gate signal; a second switching circuit unit connected between a second signal port for signal transmission and reception and the common connection node and operated according to a second gate signal; a negative voltage generating unit generating a negative voltage using a voltage of an RF signal from the common connection node; a gate signal generating unit generating the first and second gate signals using the negative voltage from the negative voltage generating unit and an operating voltage according to a switching control signal; and a control unit generating the switching control signal according to a system operation control signal.

According to an exemplary embodiment in the present disclosure, an electronic device may include: a first switching circuit unit connected between a first signal port for signal transmission and reception and a common connection node connected to an antenna port and operated according to a first gate signal; a second switching circuit unit connected between a second signal port for signal transmission and reception and the common connection node and operated according to a second gate signal; a negative voltage generating unit generating a negative voltage using a voltage of an RF signal from the common connection node; a first gate signal generating unit selecting one of the negative voltage from the negative voltage generating unit and an operating voltage according to a first switching control signal, and providing the selected voltage as the first gate signal; a second gate signal generating unit selecting the other of the negative voltage from the negative voltage generating unit and the operating voltage, which has not been selected by the first gate signal generating unit, according to a second switching control signal having a phase different from a phase of the first switching control signal, and providing the selected voltage as the second gate signal; and a control unit generating the first and second switching control signals in the mutually opposite phase relations according to a system operation control signal.

The negative voltage generating unit may include: a level adjusting unit adjusting a voltage level of an RF signal from the common connection node; and a negative rectifying unit negative-rectifying the RF signal with a voltage level adjusted by the level adjusting unit to generate the negative voltage.

The level adjusting unit may include: first to Nth MOS transistors connected in series between the common connection node and an input terminal of the negative rectifying unit and reducing a voltage level of the RF signal; impedance resistors connected between gates and grounds of the first to Nth MOS transistors, respectively; and path resistors connected between sources and drains of the first to Nth MOS transistors, respectively.

The negative rectifying unit may include: a negative rectifying circuit negative-rectifying the RF signal with a voltage level adjusted by the level adjusting unit; and a smoothing unit smoothing a voltage rectified by the negative rectifying circuit and providing the negative voltage.

The control unit may include: a controller generating a control signal according to the system operation control signal; and a level converter converting a level of the control signal and generating the first and second switching control signals having the mutually opposite phases.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
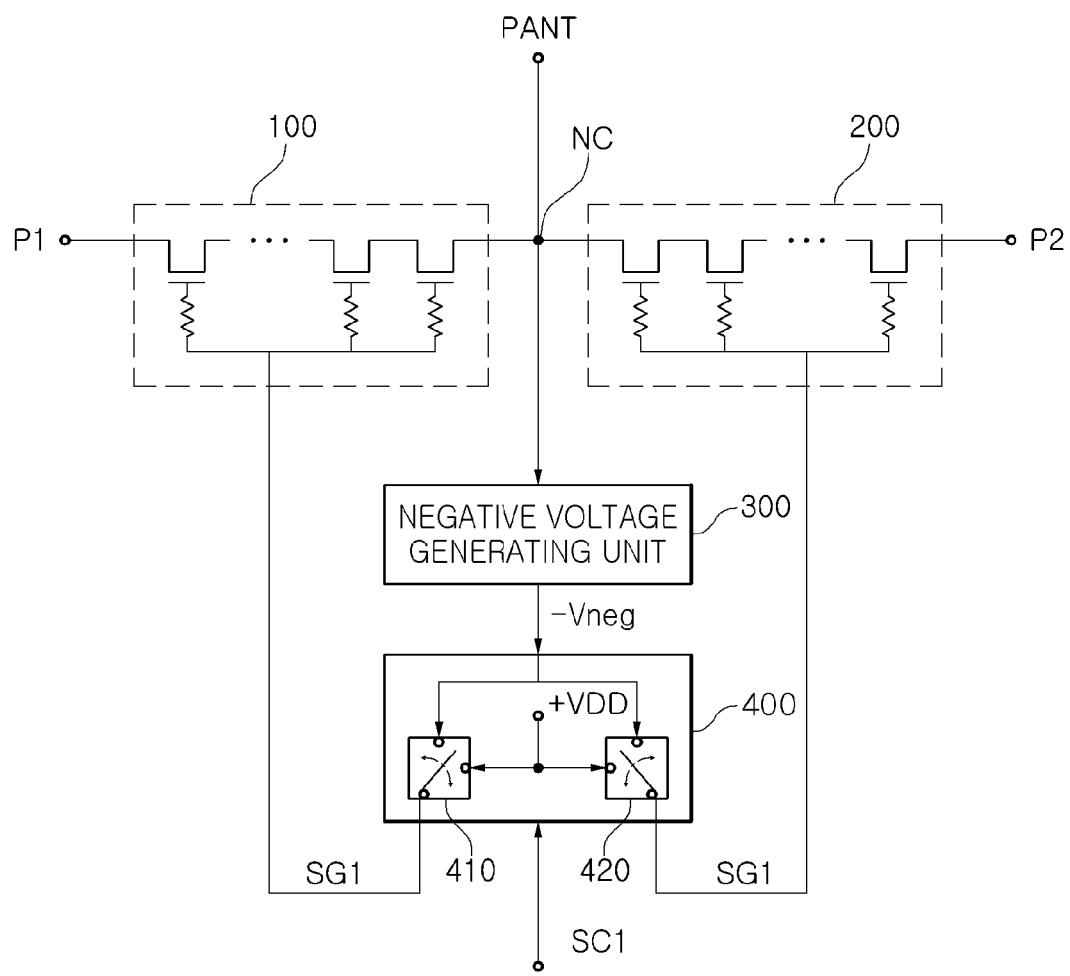
FIG. 1 is a view illustrating a first configuration of a radio frequency (RF) switching circuit according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

Figure 2:
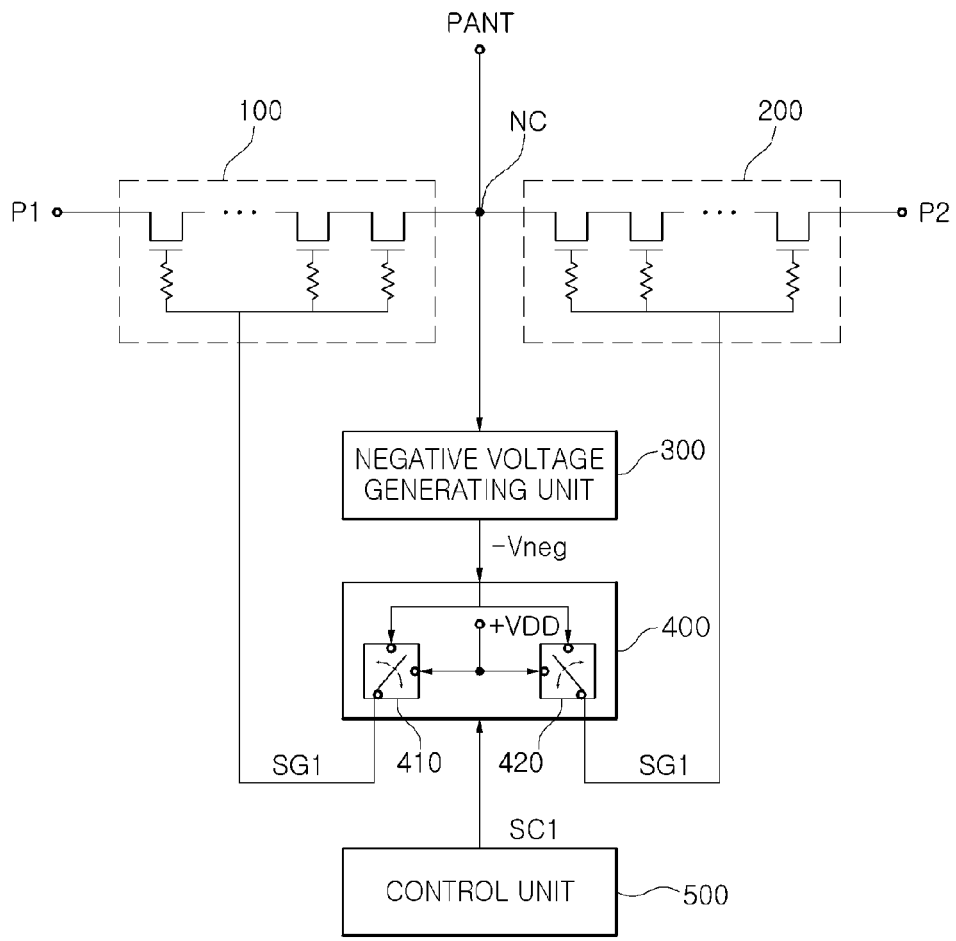
FIG. 2 is a view illustrating a second configuration of an RF switching circuit according to an exemplary embodiment of the present disclosure.

FIG. 1 is a view illustrating a first configuration of a radio frequency (RF) switching circuit according to an exemplary embodiment of the present disclosure, and FIG. 2 is a view illustrating a second configuration of an RF switching circuit according to an exemplary embodiment of the present disclosure.

Referring to FIG. 1, an RF switching circuit according to an exemplary embodiment of the present disclosure may include a first switching circuit unit 100, a second switching circuit unit 200, a negative voltage generating unit 300, and a gate signal generating unit 400.

Referring to FIG. 2, an electronic device according to an exemplary embodiment of the present disclosure may include a first switching circuit unit 100, a second switching circuit unit 200, a negative voltage generating unit 300, a gate signal generating unit 400, and a control unit 500.

Referring to FIGS. 1 and 2, the first switching circuit unit 100 may be connected between a first signal port P1 for signal transmission and reception and a common connection node NC connected to an antenna port PANT and operated by a first gate signal SG1.

For example, in a case in which the first signal port P1 is a reception port, when the first gate signal SG1 has a high level in a reception mode, the first switching circuit unit 100 may be turned on to provide a reception signal input through the antenna port PANT and the common connection node NC to a reception unit (not shown). On the other hand, when the first gate signal SG1 has a negative level in a transmission mode, the first switching circuit unit 100 may be turned off.

The second switching circuit unit 200 may be connected between a second signal port P2 for signal transmission and reception and the common connection node NC and operated according to a second gate signal SG2.

For example, in a case in which the first signal port P1 is a reception port and the second signal port P2 is a transmission port, when the second gate signal SG2 has a high level in the transmission mode, the second switching circuit unit 200 may be turned on to provide a transmission signal amplified to have high output power in a transmission unit (not shown) to the antenna port PANT. On the other hand, when the second gate signal SG2 has a negative level in the reception mode, the second switching circuit unit 200 may be turned off.

Hereinafter, operations of generating the first and second gate signals SG1 and SG2 will be described.

First, the negative voltage generating unit 300 may generate a negative voltage −Vneg using a voltage of an RF signal from the common connection node NC.

Here, the negative voltage −Vneg, a negative voltage included in a range from a zero voltage (0V) to a negative operating voltage (−VDD), may be determined according to a peak voltage value of an RF signal from the common connection node NC. This will be described with reference to FIGS. 12 through 14 hereinafter.

The gate signal generating unit 400 may generate the first and second gate signals SG1 and SG2 using the negative voltage −Vneg from the negative voltage generating unit 300 and an operating voltage +VDD according to a switching control signal SC1.

For example, the gate signal generating unit 400 may include a first gate signal generating unit 410 and a second gate signal generating unit 420.

The first gate signal generating unit 410 may select one of the negative voltage −Vneg from the negative voltage generating unit 300 and the operating voltage +VDD according to the switching control signal SC1 and provide the first gate signal SG1.

The second gate signal generating unit 420 may select the other of the negative voltage −Vneg from the negative voltage generating unit 300 and the operating voltage +VDD, which has not been selected by the first gate signal generating unit 410, according to the switching control signal SC1 and provide the second gate signal SG2.

For example, in a case in which the first signal port P1 is a reception port, the second signal port P2 is a transmission port, and a mode is a reception mode, the first gate signal generating unit 410 may select the operating voltage +VDD to provide the first gate signal SG1 having a high level +VDD, and the second gate signal generating unit 420 selects the negative voltage −Vneg to provide the second gate signal SG2 having a negative voltage level.

Meanwhile, in case of a transmission mode, the second gate signal generating unit 420 may select the operating voltage +VDD to provide the second gate signal SG2 having the high level +VDD and the first gate signal generating unit 410 may select the negative voltage −Vneg to provide the first gate signal SG1 having the negative voltage level.

According to the operation as described above, since the negative voltage −Vneg is supplied as the second gate signal SG2 to a gate of each of the plurality of MOS transistors included in the second gate signal generating unit 420 in the reception mode, the second gate signal generating unit 410 may be definitely turned off.

Also, since the negative voltage −Vneg is supplied as the first gate signal SG1 to a gate of each of the plurality of MOS transistors included in the first gate signal generating unit 410 in the transmission mode, the first gate signal generating unit 410 may be definitely turned off.

Accordingly, since the negative voltage −Vneg is supplied to the first gate signal generating unit 410 or the second gate signal generating unit 420 to turn off the first gate signal generating unit 410 or the second gate signal generating unit 420, isolation characteristics may be enhanced. This will be described with reference to FIG. 16 hereinafter.

Also, referring to FIG. 2, the control unit 500 may generate the switching control signal SC1 according to a system operation control signal.

For example, the system operation control signal may correspond to a reception mode or a transmission mode. In this case, for example, the control unit 500 may be included in an RF switching circuit unit. Alternatively, the control unit 500 may be included in an electronic device to which the RF switching circuit unit is applied, rather than being included in the RF switching circuit unit.

Figure 3:
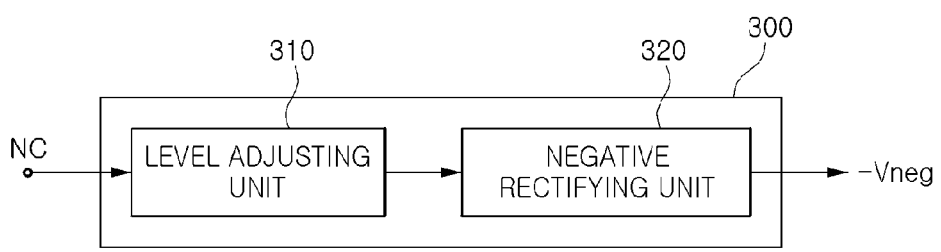
FIG. 3 is a view illustrating a configuration of a negative voltage generating unit according to an exemplary embodiment of the present disclosure.

FIG. 3 is a view illustrating a configuration of a negative voltage generating unit according to an exemplary embodiment of the present disclosure.

Referring to FIG. 3, for example, the negative voltage generating unit 300 may include a level adjusting unit 310 and a negative rectifying unit 320.

The level adjusting unit 310 may adjust a voltage level of an RF signal from the common connection node NC to a signal level required by the negative rectifying unit 320.

The negative rectifying unit 320 may negative-rectify an RF signal having a level adjusted by the level adjusting unit 310 to generate the negative voltage −Vneg.

Figure 4:
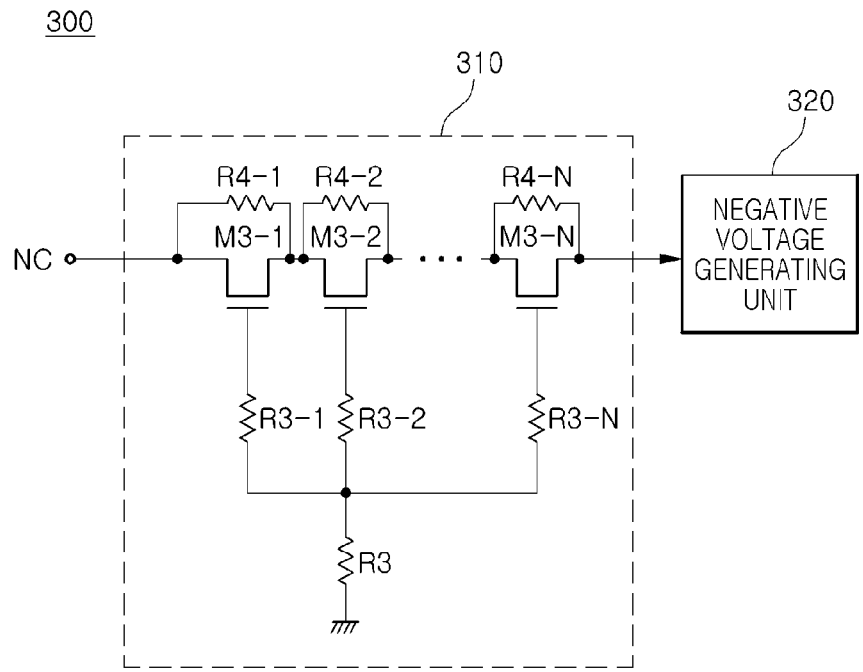
FIG. 4 is a view illustrating a first implementation of a level adjusting unit according to an exemplary embodiment of the present disclosure.
Figure 5:
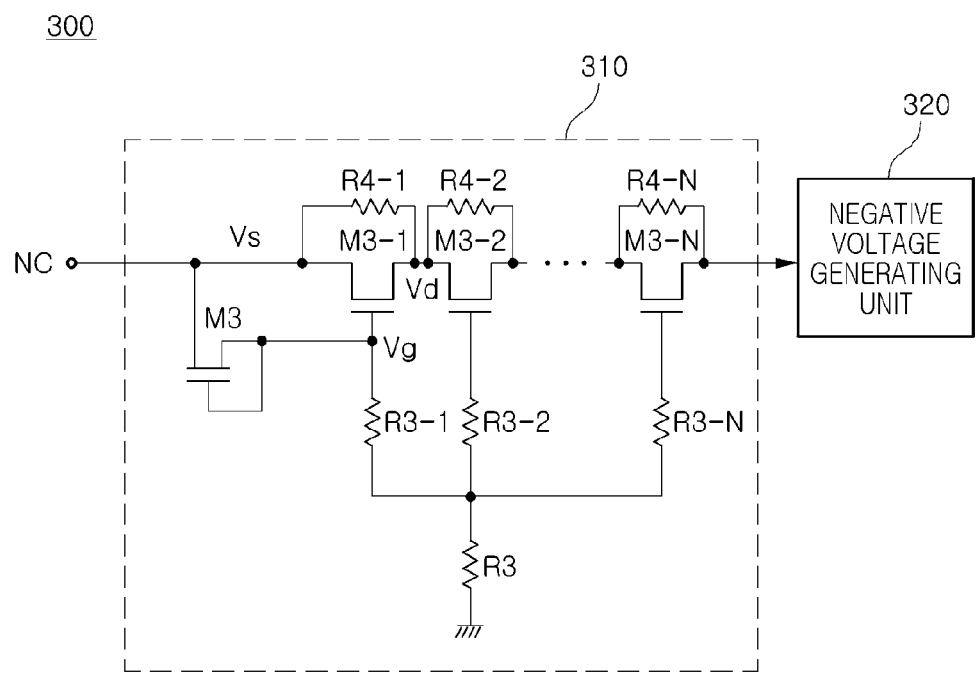
FIG. 5 is a view illustrating a second implementation of a level adjusting unit according to an exemplary embodiment of the present disclosure.
Figure 6:
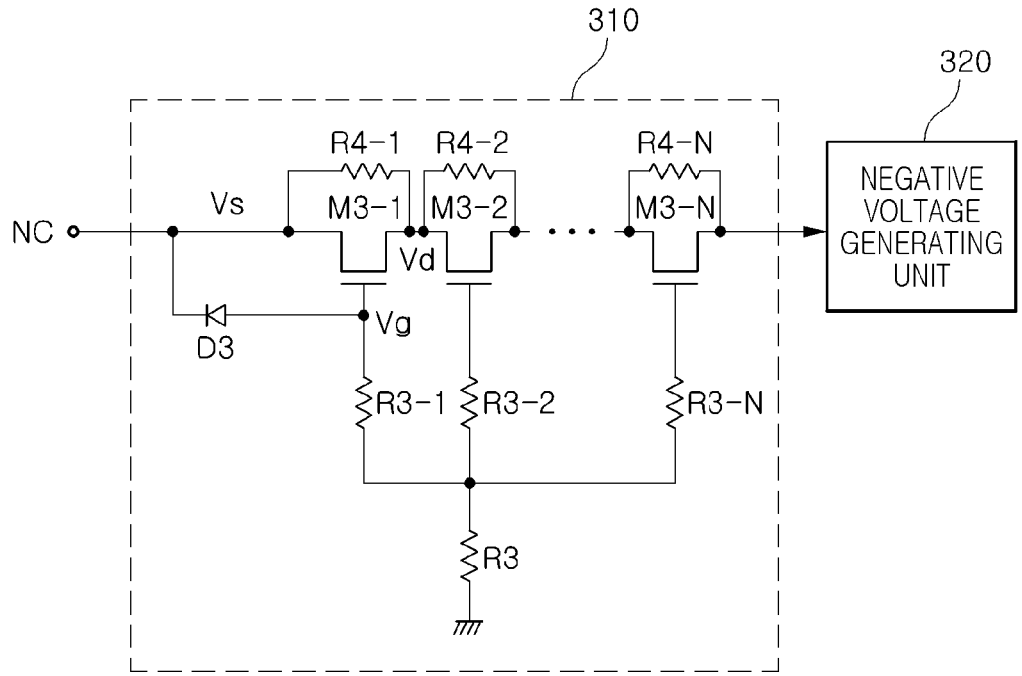
FIG. 6 is a view illustrating third implementation of a level adjusting unit according to an exemplary embodiment of the present disclosure.

FIG. 4 is a view illustrating a first implementation of a level adjusting unit according to an exemplary embodiment of the present disclosure, FIG. 5 is a view illustrating a second implementation of a level adjusting unit according to an exemplary embodiment of the present disclosure, and FIG. 6 is a view illustrating third implementation of a level adjusting unit according to an exemplary embodiment of the present disclosure.

Referring to FIGS. 4, 5, and 6, the level adjusting unit 310 may include first to Nth MOS transistors M3-1 to M3-N connected in series between the common connection node NC and an input terminal of the negative rectifying unit 320 and reducing a voltage level of the RF signal, impedance resistors R3 and R3-1 to R3-N connected between gates of the first to Nth MOS transistors M3-1 to M3-N and a ground, respectively; and path resistors R4-1 to R4-N connected between sources and drains of the first to Nth MOS transistors M3-1 to M3-N, respectively.

Here, N is a natural number of 1 or greater, and the number of MOS transistors included in the level adjusting unit 310 may be determined according to a peak voltage value of the RF signal from the common connection node NC and a breakdown voltage of the MOS transistors of the level adjusting unit 310. For example, when a peak voltage value of the RF signal from the common connection node NC is 17V and a breakdown voltage of the MOS transistors is 3.5V, at least five MOS transistors need to be used.

Here, since the first to Nth MOS transistors M3-1 to M3-N are connected to the ground through the impedance resistors R3 and R3-1 to R3-N, the first to Nth MOS transistors M3-1 to M3-N may be turned off. Each of the first to Nth MOS transistors M3-1 to M3-N in the OFF state operate as a capacitor equivalently, and each capacitor acts as impedance with respect to the RF signal, and thus, a voltage level of the RF signal from the common connection node NC may be reduced by each of the first to Nth MOS transistors M3-1 to M3-N.

A direct current (DC) level (for example, 0V) of the common connection node NC may be provided as a reference DC level of the negative rectifying unit 320 through each of the path resistors R4-1 to R4-N connected between sources and drains of the first to Nth MOS transistors M3-1 to M3-N, respectively.

Referring to FIG. 5, the level adjusting unit 310 may further include a MOS transistor M3 with a source connected to the common connection node NC and a drain and a gate connected to a gate of the first MOS transistor M3-1, having a diode connection structure.

Referring to FIG. 6, the level adjusting unit 310 may further include a diode D3 having a cathode connected to the common connection node NC and an anode connected to the gate of the first MOS transistor M3-1.

Figure 7:
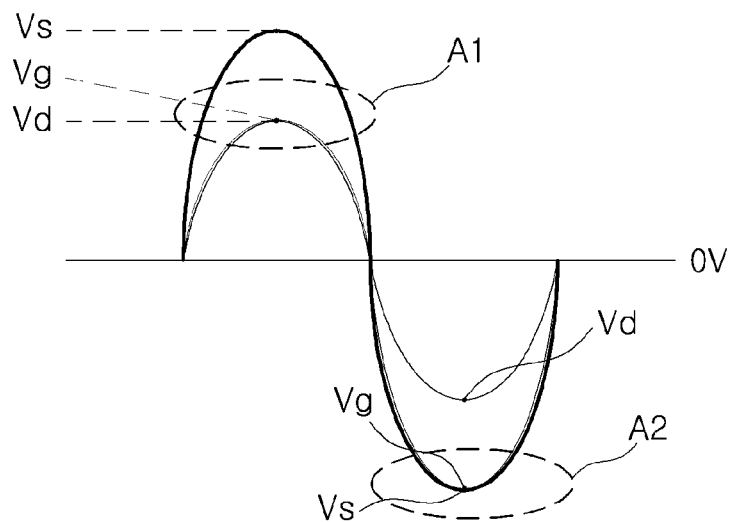
FIG. 7 is a view illustrating waveforms of each of a source voltage, a gate voltage, and a drain voltage of a first metal-oxide silicon (MOS) transistor of a level adjusting unit according to an exemplary embodiment of the present disclosure.

FIG. 7 is a view illustrating waveforms of each of a source voltage, a gate voltage, and a drain voltage of a first metal-oxide silicon (MOS) transistor of a level adjusting unit according to an exemplary embodiment of the present disclosure.

Referring to FIGS. 5, 6, and 7, in an exemplary embodiment of the present disclosure, among a source voltage Vs, a gate voltage Vg, and a drain voltage Vd of the first MOS transistor M3-1 included in the level adjusting unit 310, the gate voltage Vg is determined according to an operation of the MOS transistor M3 of FIG. 5 and the diode D3 of FIG. 6.

Namely, it can be seen that, as indicated by A1, a positive voltage swing of the source voltage Vg is reduced to become substantially equal to the drain voltage Vd, and as indicated by A2, a negative voltage swing of the source voltage Vg is increased to become substantially equal to the source voltage Vs. Here, it can be seen that, in the positive voltage, a gate-drain voltage Vgd is lower than a threshold voltage Vth of the transistor, and in the negative voltage, a gate-source voltage Vgs is lower than the threshold voltage Vth of the transistor.

Figure 8:
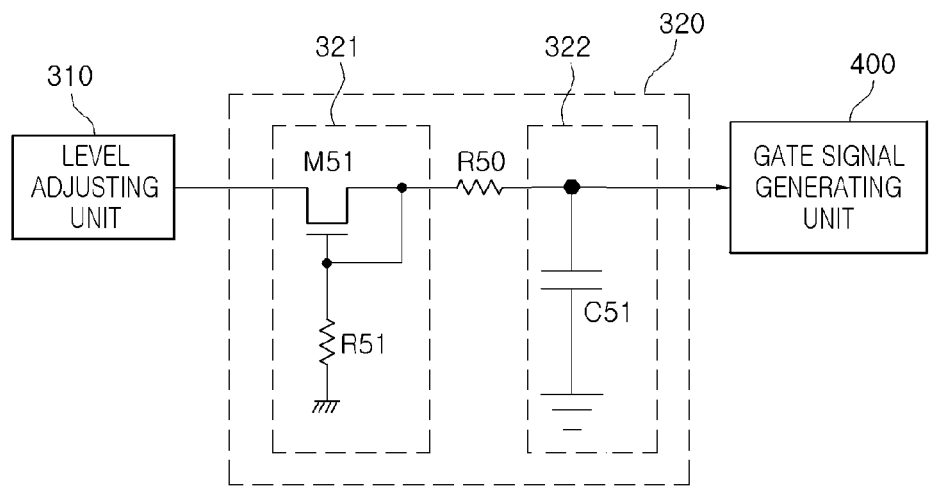
FIG. 8 is a view illustrating a first implementation of a negative rectifying unit according to an exemplary embodiment of the present disclosure.
Figure 9:
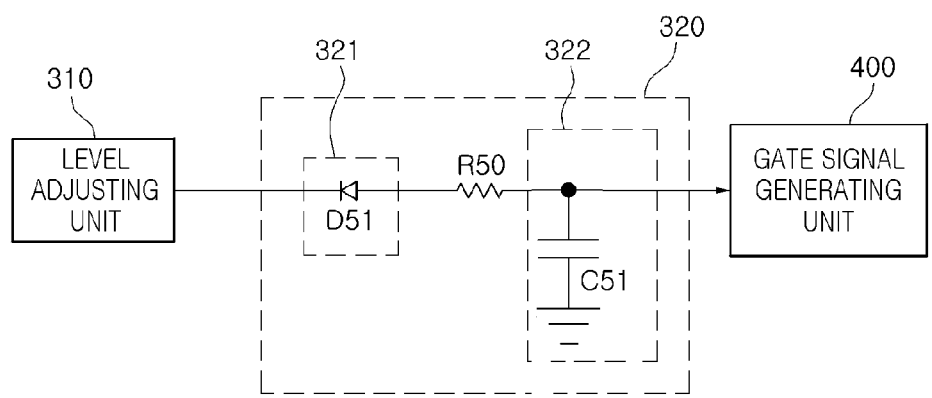
FIG. 9 is a view illustrating a second implementation of a negative rectifying unit according to an exemplary embodiment of the present disclosure.

FIG. 8 is a view illustrating a first implementation of a negative rectifying unit according to an exemplary embodiment of the present disclosure, and FIG. 9 is a view illustrating a second implementation of a negative rectifying unit according to an exemplary embodiment of the present disclosure.

Referring to FIGS. 8 and 9, for example, the negative rectifying unit 320 may include a negative rectifying circuit 321 and a smoothing unit 322.

The negative rectifying circuit 321 may negative-rectify an RF signal adjusted by the level adjusting unit 310.

The smoothing unit 322 may smooth the voltage rectified by the negative rectifying circuit 321 to provide the negative voltage −Vneg.

For example, the smoothing unit 322 may include a smoothing capacitor C51 connected between a line connected to an output terminal of the negative rectifying circuit 321 through a resistor R50 and a ground.

Referring to FIG. 8, the negative rectifying circuit 321 may include a rectifying MOS transistor M51 having a diode connection structure with a source connected to the level adjusting unit 310 and a drain and a gate connected to the smoothing unit 322, and a resistor R51 connected between the rectifying MOS transistor M51 and a ground.

Referring to FIG. 9, the negative rectifying circuit 321 may include a rectifying diode D51 having a cathode connected to the level adjusting unit 310 and an anode connected to the smoothing unit 322.

Figure 10:
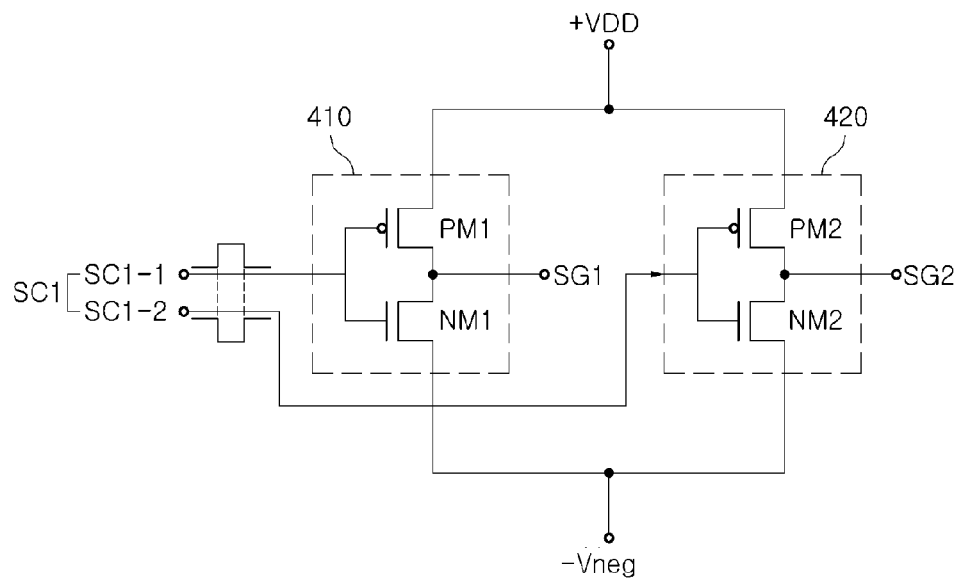
FIG. 10 is a view illustrating implementation of a gate signal generating unit according to an exemplary embodiment of the present disclosure.

FIG. 10 is a view illustrating implementation of a gate signal generating unit according to an exemplary embodiment of the present disclosure.

Referring to FIG. 10, for example, the first gate signal generating unit 410 may include a first PMOS transistor PM1 and a first NMOS transistor NM1 complementarily operating according to a first switching control signal SC1-1.

Here, when the first PMOS transistor PM1 is turned on, an operating voltage +VDD may be provided as a first gate signal SG1, and when the first NMOS transistor NM1 is turned on, a negative voltage −Vneg may be provided as a first gate signal SG1.

Also, for example, the second gate signal generating unit 420 may include a second PMOS transistor PM2 and a second NMOS transistor NM2 complementarily operating according to a second switching control signal SC1-2.

Here, when the second PMOS transistor PM2 is turned on, an operating voltage +VDD may be provided as a second gate signal SG2, and when the second NMOS transistor NM2 is turned on, a negative voltage −Vneg may be provided as a second gate signal SG2.

Figure 11:
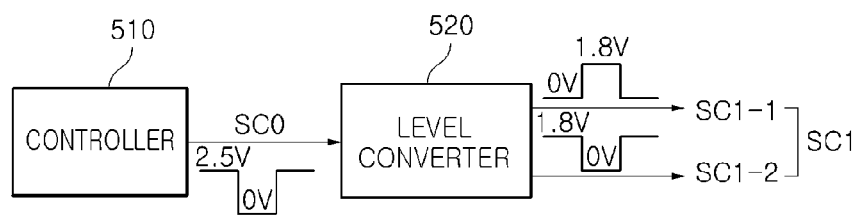
FIG. 11 is a view illustrating implementation of a control unit according to an exemplary embodiment of the present disclosure.

FIG. 11 is a view illustrating implementation of a control unit according to an exemplary embodiment of the present disclosure.

Referring to FIG. 11, for example, the control unit 500 may include a controller 510 and a level converter 520.

The controller 510 may generate a control signal SC0 according to the system operation control signal. The control signal SC0 may be, for example, a signal having a high level of 1.8V and a low level of 0V. When the gate signal generating unit 400 is controllable with the control signal SC0, first and second switching control signals SC1-1 and SC1-2 in a mutually opposite-phase relation may be generated using the control signal SC0. On the other hand, when the gate signal generating unit 400 is not controllable with the control signal SC0 due to different levels, the level converter 520 may be required.

The level converter 520 may convert a level of the control signal SC0 and generate the first and second switching control signals SC1-1 and SC1-2 having mutually opposite phases.

For example, in a case in which the first switching control signal SC1-1 has a −2.5V level, the second switching control signal SC1-2 may have a 2.5V level, and on the other hand, when the first switching control signal SC1-1 has a 2.5V level, the second switching control signal SC1-2 may have a −2.5V level.

Figure 12:
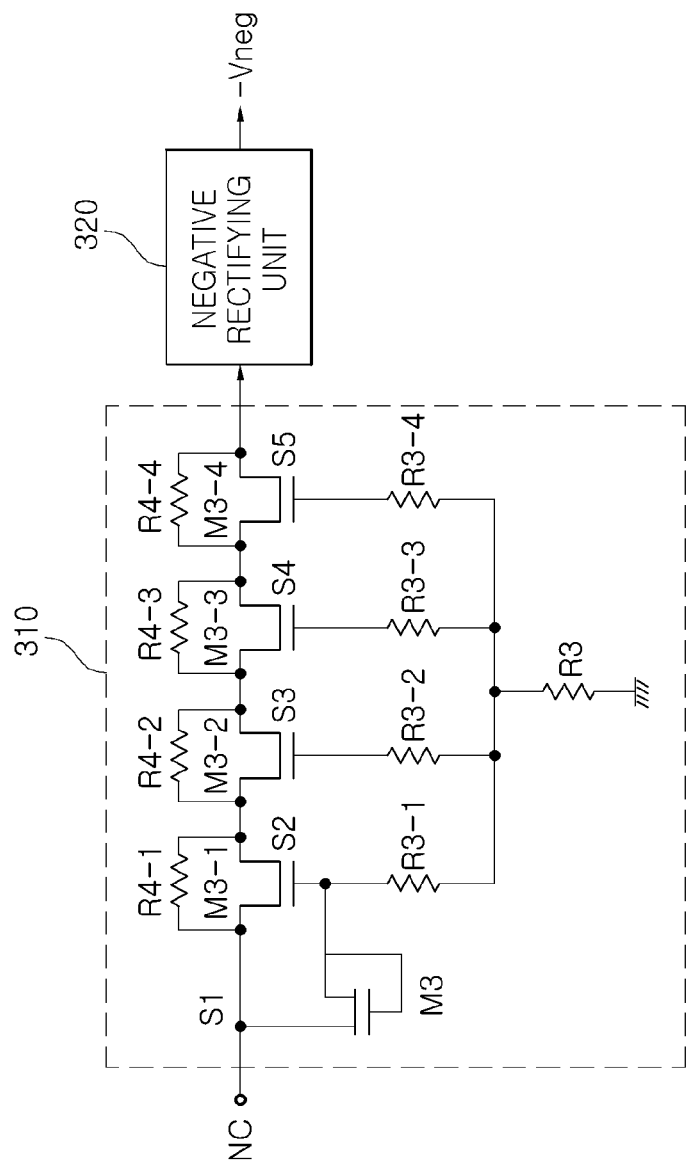
FIG. 12 is a view illustrating implementation of a negative voltage generating unit according to an exemplary embodiment of the present disclosure.
Figure 13:
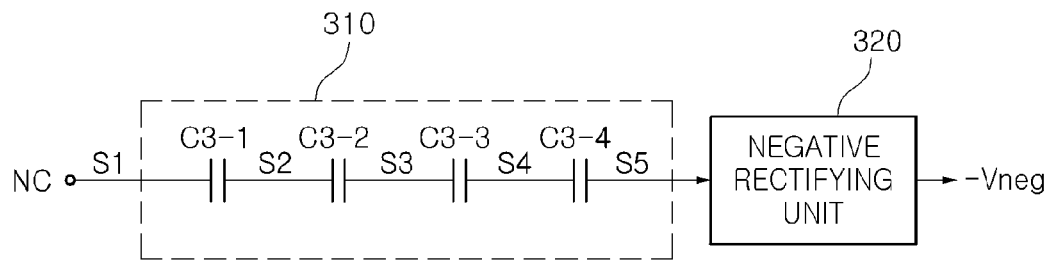
FIG. 13 is an equivalent circuit diagram of the negative voltage generating unit of FIG. 11.
Figure 14:
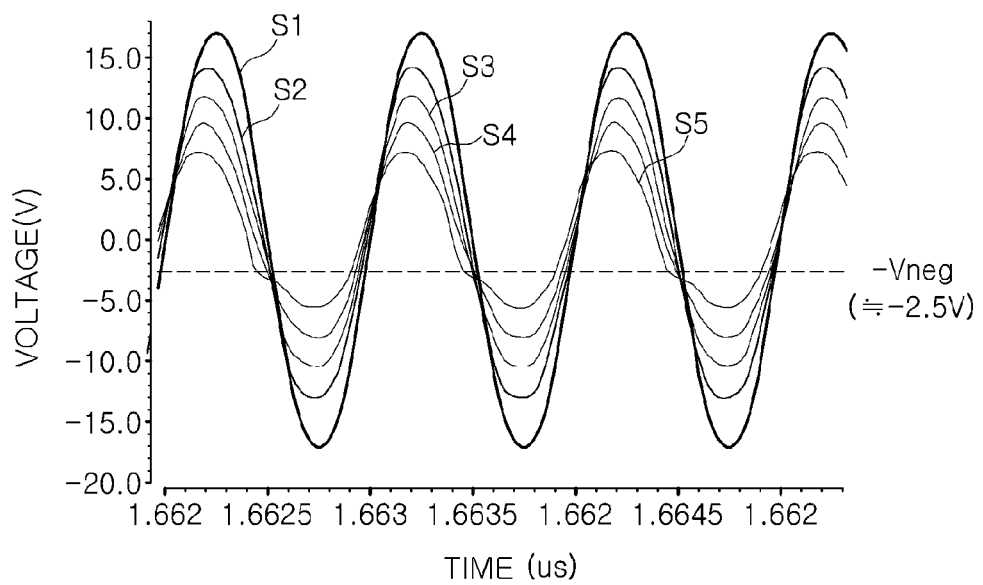
FIG. 14 is a waveform view illustrating waveforms of major signals of FIG. 12.

FIG. 12 is a view illustrating implementation of a negative voltage generating unit according to an exemplary embodiment of the present disclosure, FIG. 13 is an equivalent circuit diagram of the negative voltage generating unit of FIG. 11, and FIG. 14 is a waveform view illustrating waveforms of major signals of FIG. 12.

Referring to FIG. 12, for example, the level adjusting unit 310 of the negative voltage generating unit 300 may include four MOS transistors, i.e., first to fourth MOS transistors M3-1 to M3-4, and each of the first to fourth MOS transistors M3-1 to M3-4 are turned off, the first to fourth MOS transistors M3-1 to M3-4 operate as capacitors C3-1 to C3-4, respectively, and thus, the level adjusting unit 310 may be illustrated as an equivalent circuit illustrated in FIG. 13.

Meanwhile, when one of the first signal port P1 and the second signal port P2 is a transmission port, a transmission signal having a high power level is transmitted to the common connection node NC through the antenna in the transmission mode. Here, when power of the transmission signal at the common connection node NC is, for example, 35 dBm, a peak voltage value may be about 24V.

For example, a peak value of an input signal S1 of the level adjusting unit 310 is ±17V, peak level values of signals S1 to S5 at nodes from an input terminal to an output terminal of the level adjusting unit 310 may be approximately 17V, 14V, 12V, 9, 5V, and 7V, respectively, being gradually reduced, as illustrated in FIG. 14.

When negative-rectified by the negative rectifying unit 320, the output signal S5 of the level adjusting unit 310 may become −2.5V, a negative voltage −Vneg, as illustrated in FIG. 14.

Figure 15:
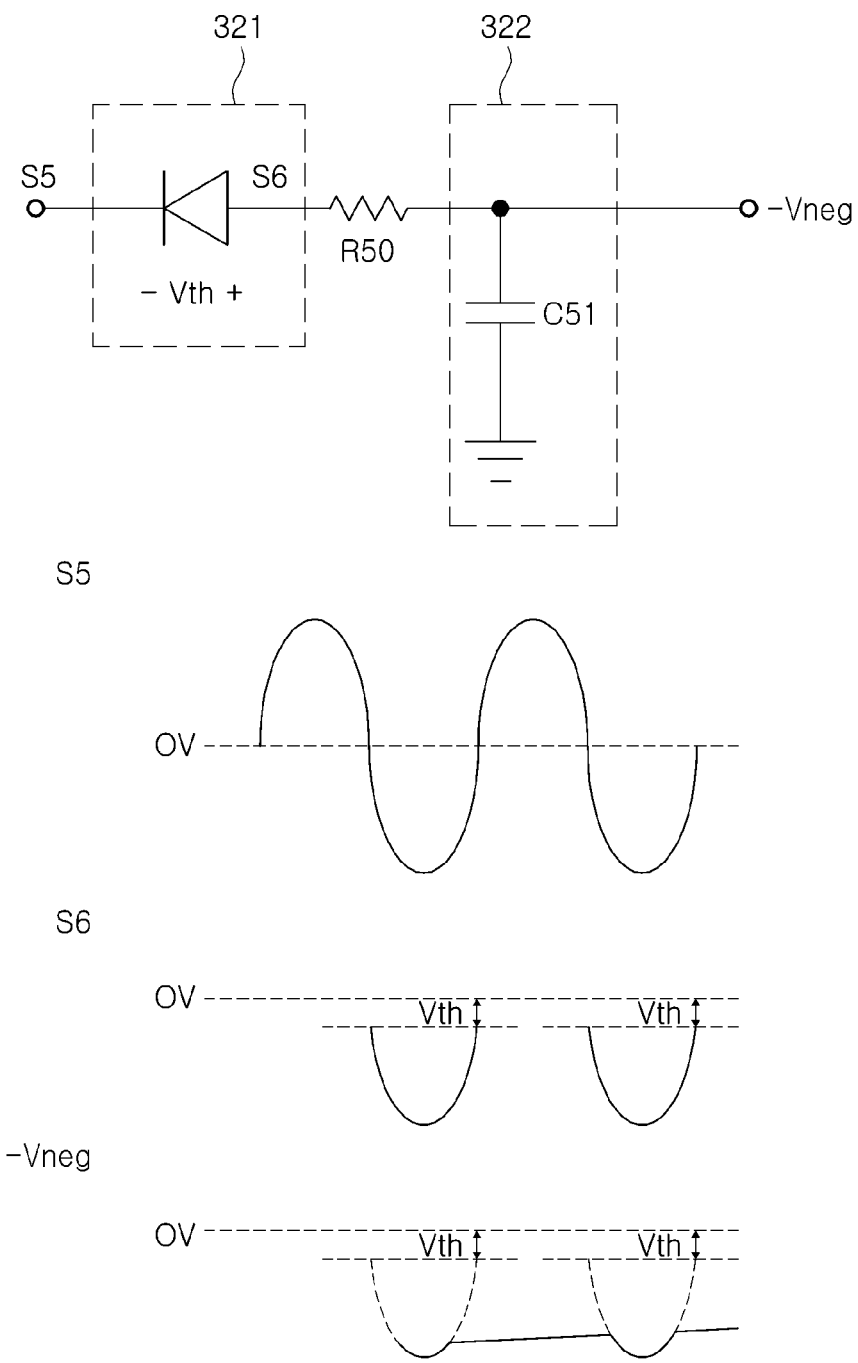
FIG. 15 is a view illustrating an operation of a negative rectifying unit according to an exemplary embodiment of the present disclosure.

FIG. 15 is a view illustrating an operation of a negative rectifying unit according to an exemplary embodiment of the present disclosure.

For example, the signal S5 input to the negative rectifying circuit 321 of the negative rectifying unit 320, the signal S6 output from the negative rectifying circuit 321, and the negative voltage −Vneg output from the smoothing unit 322 may have waveforms, respectively, as illustrated in FIG. 15.

Figure 16:
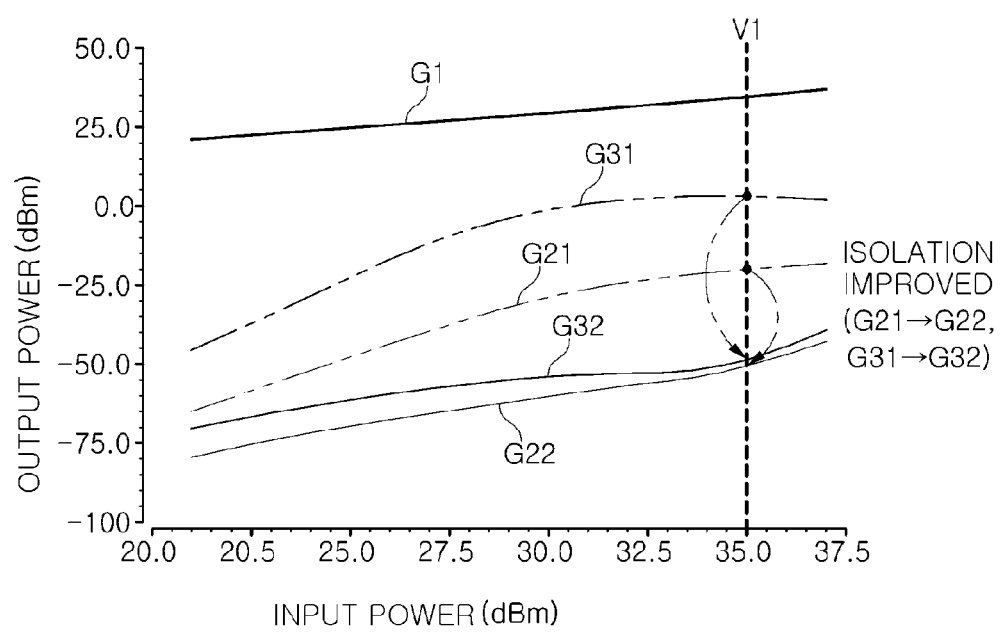
FIG. 16 is a graph illustrating isolation characteristics of an RF switching circuit according to an exemplary embodiment of the present disclosure.

FIG. 16 is a graph illustrating isolation characteristics of an RF switching circuit according to an exemplary embodiment of the present disclosure.

In FIG. 16, G1 represents input and output power with respect to a fundamental wave of a frequency in use, G21 and G31 respectively represent input and output power with respect to secondary and tertiary harmonics in case of using a 0V gate signal to control to an OFF state, and G22 and G32 respectively represent input and output power with respect to secondary and tertiary harmonics in case of using a negative voltage as a gate signal according to an exemplary embodiment of the present disclosure to control to an OFF state.

Referring to FIG. 16, output power is 75 dBm or higher with respect to secondary and tertiary harmonics when input power is 35 dBm in the RF switching circuit, obtaining high isolation characteristics.

According to the exemplary embodiments of the present disclosure as described above, since a DC negative voltage is generated directly using an RF signal without a negative voltage generating unit based on an operating voltage, an extra power source is not used, and thus, power is not consumed to generate a negative voltage.

Also, according to the exemplary embodiments of the present disclosure, since a negative voltage varied according to a change in a peak value of an RF signal at the common connection node NC, rather than having a constant level all the time, is generated, high isolation characteristics as described above may be obtained.

As set forth above, in the RF switching circuit according to exemplary embodiments of the present disclosure, a negative gate signal may be generated using a voltage level of an RF signal at a common connection node to which an antenna is connected, without using a negative voltage generating unit using a source voltage, and thus, the negative gate signal may be generated without increasing power consumption and isolation characteristics of the RF switching circuit may be enhanced.

While exemplary embodiments have been shown and described above, it will be apparent to those skilled in the art that modifications and variations could be made without departing from the spirit and scope of the present disclosure as defined by the appended claims.

What is claimed is:

1. A radio frequency (RF) switching circuit comprising: a first switching circuit unit connected between a first signal port for signal transmission and reception and a common connection node connected to an antenna port and operated according to a first gate signal; a second switching circuit unit connected between a second signal port for signal transmission and reception and the common connection node and operated according to a second gate signal; a negative voltage generating unit generating a negative voltage using a voltage of an RF signal from the common connection node; and a gate signal generating unit generating the first and second gate signals using the negative voltage from the negative voltage generating unit and an operating voltage according to a switching control signal, and a control unit generating a switching control signal according to a system operation control signal.

2. The RF switching circuit of claim 1, wherein the negative voltage generating unit includes:
   a level adjusting unit adjusting a voltage level of an RF signal from the common connection node; and
   a negative rectifying unit negative-rectifying the RF signal with a voltage level adjusted by the level adjusting unit to generate the negative voltage.

3. The RF switching circuit of claim 2, wherein the level adjusting unit includes:
   first to Nth MOS transistors connected in series between the common connection node and an input terminal of the negative rectifying unit and reducing a voltage level of the RF signal;
   impedance resistors connected between gates and grounds of the first to Nth MOS transistors, respectively; and
   path resistors connected between sources and drains of the first to Nth MOS transistors, respectively.

4. The RF switching circuit of claim 2, wherein the negative rectifying unit includes:
   a negative rectifying circuit negative-rectifying the RF signal with a voltage level adjusted by the level adjusting unit; and
   a smoothing unit smoothing a voltage rectified by the negative rectifying circuit and providing the negative voltage.

5. A radio frequency (RF) switching circuit comprising:
   a first switching circuit unit connected between a first signal port for signal transmission and reception and a common connection node connected to an antenna port and operated according to a first gate signal;
   a second switching circuit unit connected between a second signal port for signal transmission and reception and the common connection node and operated according to a second gate signal;
   a negative voltage generating unit generating a negative voltage using a voltage of an RF signal from the common connection node;
   a first gate signal generating unit selecting one of the negative voltage from the negative voltage generating unit and an operating voltage according to a switching control signal, and providing the selected voltage as the first gate signal; and
   a second gate signal generating unit selecting the other of the negative voltage from the negative voltage generating unit and the operating voltage, which has not been selected by the first gate signal generating unit, according to the switching control signal, and providing the selected voltage as the second gate signal.

6. The RF switching circuit of claim 5, wherein the negative voltage generating unit includes:
   a level adjusting unit adjusting a voltage level of an RF signal from the common connection node; and
   a negative rectifying unit negative-rectifying the RF signal with a voltage level adjusted by the level adjusting unit to generate the negative voltage.

7. The RF switching circuit of claim 6, wherein the level adjusting unit includes:
   first to Nth MOS transistors connected in series between the common connection node and an input terminal of the negative rectifying unit and reducing a voltage level of the RF signal;
   impedance resistors connected between gates and grounds of the first to Nth MOS transistors, respectively; and
   path resistors connected between sources and drains of the first to Nth MOS transistors, respectively.

8. The RF switching circuit of claim 7, wherein the level adjusting unit further includes an MOS transistor having a diode connection structure with a source connected to the common connection node and a drain and a gate connected to the gate of the first MOS transistor.

9. The RF switching circuit of claim 6, wherein the negative rectifying unit includes:
   a negative rectifying circuit negative-rectifying the RF signal with a voltage level adjusted by the level adjusting unit; and
   a smoothing unit smoothing a voltage rectified by the negative rectifying circuit and providing the negative voltage.

10. The RF switching circuit of claim 9, wherein the negative rectifying circuit includes:
    a rectifying MOS transistor having a diode-connection structure with a source connected to the level adjusting unit and a drain and a gate connected to the smoothing unit; and
    a resistor connected between the rectifying MOS transistor and a ground.

11. The RF switching circuit of claim 9, wherein the negative rectifying circuit includes a rectifying diode having a cathode connected to the level adjusting unit and an anode connected to the smoothing unit.

12. An electronic device comprising:
    a first switching circuit unit connected between a first signal port for signal transmission and reception and a common connection node connected to an antenna port and operated according to a first gate signal;
    a second switching circuit unit connected between a second signal port for signal transmission and reception and the common connection node and operated according to a second gate signal;
    a negative voltage generating unit generating a negative voltage using a voltage of an RF signal from the common connection node;
    a gate signal generating unit generating the first and second gate signals using the negative voltage from the negative voltage generating unit and an operating voltage according to a switching control signal; and
    a control unit generating the switching control signal according to a system operation control signal.

13. The electronic device of claim 12, wherein the negative voltage generating unit includes:
    a level adjusting unit adjusting a voltage level of an RF signal from the common connection node; and
    a negative rectifying unit negative-rectifying the RF signal with a voltage level adjusted by the level adjusting unit to generate the negative voltage.

14. The electronic device of claim 13, wherein the level adjusting unit includes:
- first to Nth MOS transistors connected in series between the common connection node and an input terminal of the negative rectifying unit and reducing a voltage level of the RF signal;
- impedance resistors connected between gates and grounds of the first to Nth MOS transistors, respectively; and
- path resistors connected between sources and drains of the first to Nth MOS transistors, respectively.

15. The electronic device of claim 13, wherein the negative rectifying unit includes:
- a negative rectifying circuit negative-rectifying the RF signal with a voltage level adjusted by the level adjusting unit; and
- a smoothing unit smoothing a voltage rectified by the negative rectifying circuit and providing the negative voltage.

16. An electronic device comprising:
- a first switching circuit unit connected between a first signal port for signal transmission and reception and a common connection node connected to an antenna port and operated according to a first gate signal;
- a second switching circuit unit connected between a second signal port for signal transmission and reception and the common connection node and operated according to a second gate signal;
- a negative voltage generating unit generating a negative voltage using a voltage of an RF signal from the common connection node;
- a first gate signal generating unit selecting one of the negative voltage from the negative voltage generating unit and an operating voltage according to a first switching control signal, and providing the selected voltage as the first gate signal;
- a second gate signal generating unit selecting the other of the negative voltage from the negative voltage generating unit and the operating voltage, which has not been selected by the first gate signal generating unit, according to a second switching control signal having a phase different from a phase of the first switching control signal, and providing the selected voltage as the second gate signal; and
- a control unit generating the first and second switching control signals in the mutually opposite phase relations according to a system operation control signal.

17. The RF switching circuit of claim 16, wherein the negative voltage generating unit includes:
- a level adjusting unit adjusting a voltage level of an RF signal from the common connection node; and
- a negative rectifying unit negative-rectifying the RF signal with a voltage level adjusted by the level adjusting unit to generate the negative voltage.

18. The electronic device of claim 17, wherein the level adjusting unit includes:
- first to Nth MOS transistors connected in series between the common connection node and an input terminal of the negative rectifying unit and reducing a voltage level of the RF signal;
- impedance resistors connected between gates and grounds of the first to Nth MOS transistors, respectively; and
- path resistors connected between sources and drains of the first to Nth MOS transistors, respectively.

19. The electronic device of claim 17, wherein the negative rectifying unit includes:
- a negative rectifying circuit negative-rectifying the RF signal with a voltage level adjusted by the level adjusting unit; and
- a smoothing unit smoothing a voltage rectified by the negative rectifying circuit and providing the negative voltage.

20. The electronic device of claim 16, wherein the control unit includes:
- a controller generating a control signal according to the system operation control signal; and
- a level converter converting a level of the control signal and generating the first and second switching control signals having the mutually opposite phases.

* * * * *